United States Patent
Waltari

(10) Patent No.: US 9,912,344 B1
(45) Date of Patent: Mar. 6, 2018

(54) SORT-AND DELAY METHODS FOR TIME-TO-DIGITAL CONVERSION

(71) Applicant: IQ-Analog Corporation, San Diego, CA (US)

(72) Inventor: Mikko Waltari, Escondido, CA (US)

(73) Assignee: IQ-Analog Corp., San Diego, CA (US)

( * ) Notice: Subject to any disclaimer, the term of this patent is extended or adjusted under 35 U.S.C. 154(b) by 0 days.

(21) Appl. No.: 15/706,732

(22) Filed: Sep. 17, 2017

Related U.S. Application Data

(63) Continuation of application No. 15/614,705, filed on Jun. 6, 2017, now Pat. No. 9,831,888.

(51) Int. Cl.
  *H03M 1/12* (2006.01)
  *H03M 1/44* (2006.01)
  *H03M 1/06* (2006.01)

(52) U.S. Cl.
  CPC ....... *H03M 1/1215* (2013.01); *H03M 1/0624* (2013.01); *H03M 1/447* (2013.01)

(58) Field of Classification Search
  CPC .. H03M 1/1215; H03M 1/0624; H03M 1/447; H03M 1/3602
  USPC .................. 341/118, 120, 155; 330/224, 253
  See application file for complete search history.

(56) References Cited

U.S. PATENT DOCUMENTS

| 5,886,660 | A | 3/1999 | Lowenstein |
| 7,557,746 | B1 | 7/2009 | Waltari |
| 7,609,756 | B2 | 10/2009 | Wood |
| 7,667,633 | B2 | 2/2010 | Choi et al. |
| 8,138,843 | B2 | 3/2012 | Straayer et al. |
| 8,421,661 | B1 | 4/2013 | Jee et al. |
| 8,433,025 | B2 | 4/2013 | Sun et al. |
| 8,552,901 | B2 | 10/2013 | Danesh et al. |
| 8,669,810 | B2 * | 3/2014 | Kwon ................... G04F 10/005 330/252 |
| 8,896,477 | B2 | 11/2014 | Dosho et al. |
| 8,970,420 | B2 | 3/2015 | Henzler et al. |
| 8,988,269 | B2 | 3/2015 | Dosho |

(Continued)

OTHER PUBLICATIONS

H. Chung, H. Ishikuro, T. Kuroda, "A 10-Bit 80-MS/s Decision-Select Successive Approximation TDC in 65-nm CMOS", IEEE Journal of Solid-State Circuits, vol. 47, No. 5, May 2012.

*Primary Examiner* — Peguy Jean Pierre
(74) *Attorney, Agent, or Firm* — Law Office of Gerald Maliszewski; Gerald Maliszewski

(57) ABSTRACT

A sort-and-delay time-to-digital converter (TDC) is provided, made up of a plurality of serially connected sort-and-delay circuits. Each sort-and-delay circuit accepts a time-differential input signal with a first edge separated from a second edge by an input duration of time. The first and second edges are selectively routed as a time-differential output signal with a delayed edge separated from a trailing edge by an output duration of time representing a compression of the input duration of time. Each sort-and-delay circuit also supplies a TDC coded bit (e.g., Gray code) indicating the order in which the first and second edges are routed as leading and trailing edges. The TDC outputs a digital output signal representing the initial input duration of time associated with the initial time-differential input signal received by the initial sort-and-delay circuit. Associated TDC, sort-and-delay, and time amplification methods are also provided.

17 Claims, 12 Drawing Sheets

(56) References Cited

U.S. PATENT DOCUMENTS

| | | | |
|---|---|---|---|
| 2011/0316625 A1* | 12/2011 | Scheytt | H03F 1/32 330/207 A |
| 2013/0135126 A1* | 5/2013 | Cho | H03M 1/462 341/110 |
| 2014/0232827 A1 | 8/2014 | Kumar et al. | |
| 2015/0041625 A1 | 2/2015 | Dutton et al. | |

* cited by examiner

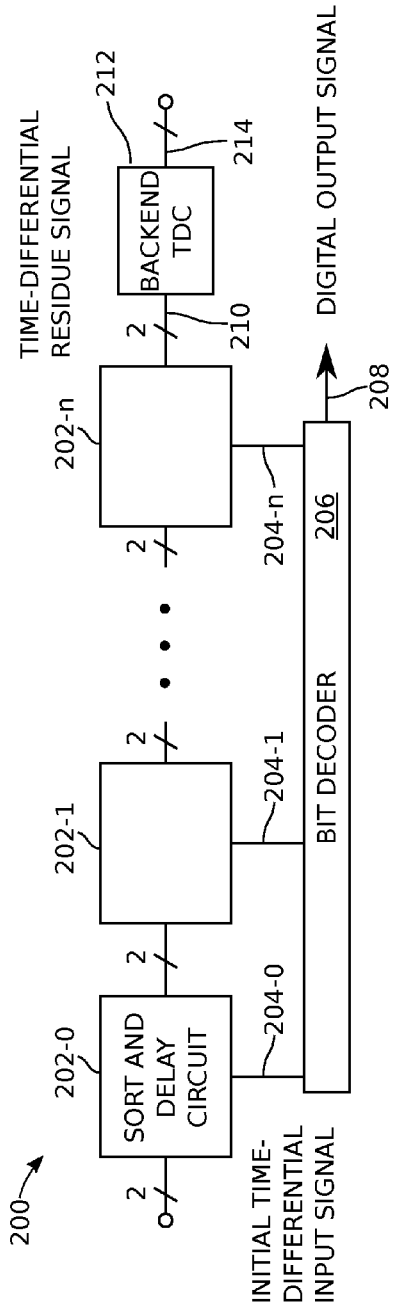
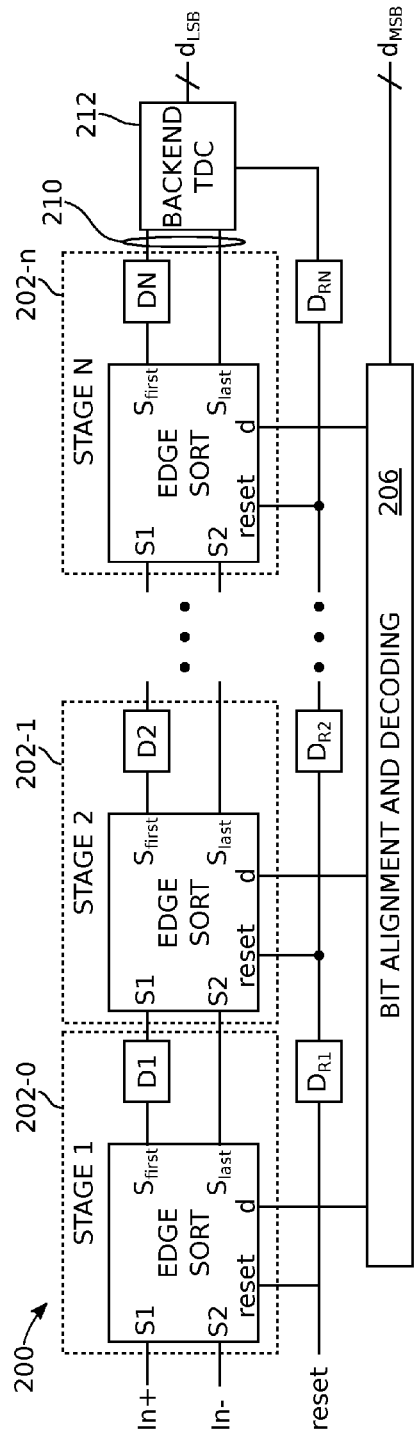
Fig. 2A
Fig. 11

SORT-AND DELAY METHODS FOR TIME-TO-DIGITAL CONVERSION

RELATED APPLICATIONS

The application is a Continuation of a parent application entitled, SORT-AND-DELAY TIME-TO-DIGITAL CONVERTER, invented by Mikko Waltari, Ser. No. 15/614,705, filed Jun. 6, 2017, which is incorporated herein by reference.

The following applications are also incorporated herein by reference:

SUB-RANGING VOLTAGE-TO-TIME-TO-DIGITAL CONVERTER, invented by Mikko Waltari, Ser. No. 14/979,186, filed Dec. 22, 2015; issued as U.S. Pat. No. 9,323,226; and, TRAVELING PULSE WAVE QUANTIZER, invented by Mikko Waltari, Ser. No. 14/681,206, filed Apr. 8, 2015; issued as U.S. Pat. No. 9,098,072.

BACKGROUND OF THE INVENTION

1. Field of the Invention

This invention generally relates to analog-to-digital converters (ADCs) and, more particularly, to a system and method for converting measured time durations to digital information.

2. Description of the Related Art

FIG. 1 is a simplified schematic of an ADC comprised of a voltage-to-time (V2T) converter and a time-to-digital converter (TDC) based upon a single slope principle (prior art). One promising way of performing very high speed analog-to-digital (A-to-D) conversion in today's most advanced CMOS technologies is to utilize time domain analog signal processing. There, the A-to-D conversion process is split in two steps. In the first step the input voltage is converted into a time domain signal using pulse position or pulse width modulation. In the second step this signal is digitized using a TDC. The advantage of this method is that most of the complexity of the design is in the TDC part, which can be implemented in digital, or digital-like circuitry that enjoys all the benefits of technology scaling in the CMOS process. A well-known example of this type of ADC is the single-slope ADC, which uses a simple digital counter as the TDC.

One commonly used TDC architecture is the gated ring-oscillator. It uses start and stop signals to define the time interval to be digitized. The start signal is used to start the oscillator and the stop signal is used to capture the state of the oscillator, and so determine its state at a sub-period level. A digital counter is used to count the number of full oscillator cycles. The speed of the counter determines the minimum oscillation periods. For instance, in modern CMOS technology the counter can operate on the order of 50 picoseconds (ps). If the desired least significant bit (LSB) size is 1 ps, there is a need for 50 sub-period quantization levels. Typically, the sub-period detection is done with parallel structures yielding a 50 bit output signal that needs to be decoded into a final, in this case 6-bit, word length. Processing these 50 bits at a fast rate is power and circuit area consuming.

Another limitation of the gated ring oscillator is that it cannot start processing the next sample while the current one is still circulating in the oscillator. This limitation can be overcome by unrolling the ring into a delay chain. However, the unrolled architecture suffers from the same parallel detection inefficiency. Yet another limitation in both architectures is that they are not truly time differential. While the measurement interval is defined to be the difference between the start and the stop signals, the start signal must always arrive before the stop signal. Thus, in a system using a pair of signals (two inputs), the start signal must always be carried on one predetermined line and the stop pulse always carried on the other line. Another popular TDC architecture, the Vernier delay line, suffers from the same issues.

As used herein, a time-differential signal is understood to be a pair of bi-level signals, where one signal (pulse) indicates the start of a time durations to be measured and the other signal indicates the end (stop) of the time duration to be measured, but where there is no predetermined correlation between which signal is the start and which signal is the stop.

It would be advantageous if the number of detectors and raw output bits of a TDC grew in proportion to N, N being the number of output bits, instead of $2^N$ as it does in parallel type detectors.

It would be advantageous if a TDC could operate with a truly time-differential input, with the capability to process several samples simultaneously in pipelined fashion.

SUMMARY OF THE INVENTION

Disclosed herein is a time-to-digital converter (TDC) that has a time-differential input enabled as a pair of bi-level input signals. In one aspect, the time interval to be digitized is defined as the time between the rising edge of the positive input signal and the rising edge of the negative input signal. The maximum time range to be digitized is from $-T/2$ to $T/2$. The time interval may be considered to be negative (less than zero duration time) if the stop (negative) input signal has a rising edge that occurs before the start (positive) input signal. As used herein, a time-differential signal is understood to be a pair of bi-level signals, where one signal (start/positive) indicates the start of a time durations to be measured and the other signal (stop/negative) indicates the end of the time duration to be measured, but where there is no predetermined correlation between which signal is the positive, first arriving signal. For the purpose of discussion rising edges are used as triggers, but the same idea can be implemented using negative edges as well.

The TDC consists of several cascaded stages, with the most significant bit (MSB) of the digital output being resolved in the front stage and the other bits in the following stages resolved in descending order. The principle of operation follows the successive approximation method. The time interval is converted into a digital word in several successive steps carried out one bit per TDC stage. Once a stage has completed its task, it passes the signal residue to the next stage. After passing the residue signal, the stage is reset and becomes ready to process the next sample.

Accordingly, a sort-and-delay time-to-digital converter is provided made up of a plurality of serially connected sort-and-delay circuits. Each sort-and-delay circuit accepts a time-differential input signal with a binary level first edge separated from a binary level second edge by an input (first) duration of time. The first and second edges are selectively routed as a time-differential output signal with a binary level delayed edge separated from a binary level trailing edge by an output (second) duration of time representing a compression of the input duration of time. Each sort-and-delay circuit also supplies a TDC coded bit indicating the order in which the first and second edges are routed to the leading and trailing edges. The TDC is also made up of a bit decoder having inputs to receive a plurality of TDC coded bits (e.g., Gray code) from the corresponding plurality of sort-and-delay circuits, and an output to supply a digital output signal representing the initial input duration of time associated with the initial time-differential input signal received by the initial sort-and-delay circuit.

In one aspect, an nth sort-and-delay circuit in a plurality of n sort-and-delay circuits supplies a time-differential residue signal, so that the bit decoder supplies a digital output signal representing the n most significant bits in a p-bit digital word. In this aspect, the sort-and-delay TDC further includes a backend conventional TDC having an input to accept the time-differential residue signal and an output to supply a digital output signal comprising the (p–n)th least significant bits of the p-bit digital word.

Each sort-and-delay circuit is made up of an edge sort circuit having an input to accept a time-differential input signal. The edge sort circuit determines the order in which the first and second edges are accepted, and has outputs to supply a leading edge, the trailing edge, and the TDC coded bit. Each sort-and-delay circuit also includes a delay circuit having an input operatively connected to the first output of the edge sort circuit, and an output to supply the delayed edge having a time delay duration (D). The delayed edge and the trailing edge are the time-differential output signal.

In one variation, the edge sort circuit includes an OR gate having a first input to accept the first edge, a second input to accept the second edge, and an output to supply the leading edge. An AND gate has a first input to accept the first edge, a second input to accept the second edge, and an output to supply the trailing edge. The edge sort circuit also includes an arrival time comparator (ATC) having a first input to accept the first edge, a second input to accept the second edge, and an output to supply an order signal responsive to the order in which the first and second edges are received. Alternatively, multiplexors can be used instead of combination logic, as provided in detail below.

In one aspect, the sort-and-delay circuit further also includes a time amplifier. In one variation a single-ended time amplifier has an input to accept the leading edge and the trailing edge. A pull-down circuit has an input to accept the leading edge and an output to supply a pull-down current to a first node, initially set to a first voltage level, in response to the leading edge. A pull-up circuit has an input to accept the trailing edge and an output to supply a pull-up current to the first node in response to the trailing edge. A capacitor has a first terminal connected to the first node and a second terminal connected to a reference voltage. Finally, a comparator has a first input connected to a threshold voltage, a second input connected to the first node, and an output to supply a time-amplified edge. The leading edge and the trailing edge are separated by a third duration of time, and the leading and the time-amplified edge are separated by an amplified duration of time, directly proportional to the third duration of time. Alternatively, a differential time amplifier may be used, as provided in more detail below.

Addition details of the above described circuitry, as well as successive approximation TDC, time amplification, and sort-and-delay methods, are provided below.

BRIEF DESCRIPTION OF THE DRAWINGS

FIGS. 2A and 2B are, respectively, a schematic block diagram depicting a sort-and-delay TDC and an associated timing diagram.

FIG. 11 is a schematic block diagram depicting the sort-and-delay TDC in slightly greater detail than shown in FIG. 2.

DETAILED DESCRIPTION

Figure 1:
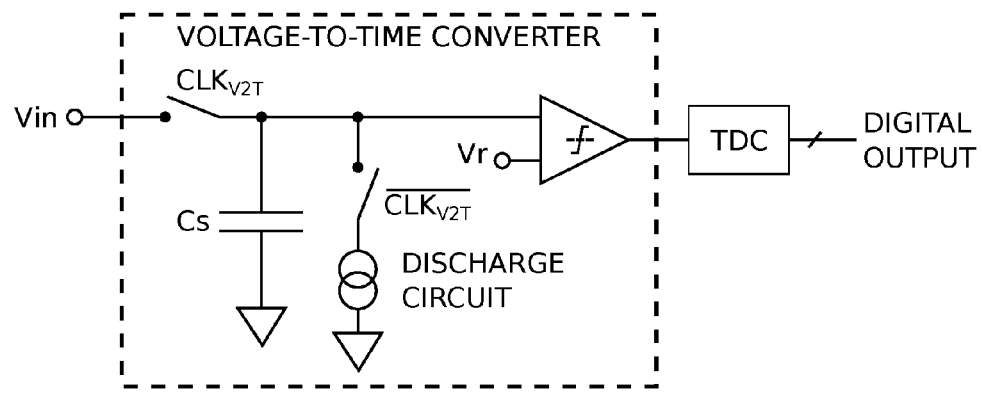
FIG. 1 is a simplified schematic of an ADC comprised of a voltage-to-time (V2T) converter and a time-to-digital converter (TDC) based upon a single slope principle (prior art).
Figure 2B:
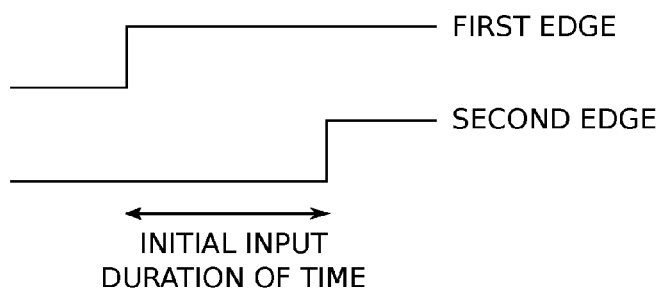

FIGS. 2A and 2B are, respectively, a schematic block diagram depicting a sort-and-delay TDC and an associated timing diagram. The sort-and-delay TDC 200 comprises a plurality of serially connected sort-and-delay circuits 202-0 through 202-n, where n is an integer greater than zero. Each sort-and-delay circuit accepts a time-differential input signal comprising a binary level first edge separated from a binary level second edge by an input or first duration of time. Each sort-and-delay circuit selectively routes respective first and second edges to a time-differential output signal comprising a binary level delayed edge separated from a binary level trailing edge by an output or second duration of time representing a compression of the input duration of time. As explained in more detail below, a time delay duration (D) is subtracted from time-differential input signal as a means of compression, to supply the time-differential output signal. Each sort-and-delay circuit supplies a TDC coded bit respectively on lines 204-0 through 204-n, indicating the order in which the first and second edges are routed as the leading and trailing edges. As used herein, a time-differential signal is understood to be a pair of bi-level signals on two separate lines, where one signal (the first edge) indicates the start of a time durations to be measured and the other signal (the second edge) indicates the end of the time duration to be measured, but where there is no predetermined correlation between the positive, first arriving signal and the line carrying the positive signal.

A bit decoder 206 has inputs to receive a plurality of TDC coded bits from the corresponding plurality of sort-and-delay circuits, and an output on line 208 to supply a digital output signal representing the initial input duration of time associated with the initial time-differential input signal received by the initial sort-and-delay circuit 202-0. For example, taken together the TDC coded bits on lines 204-0 through 204-n may be in the form of a Gray code. Although the differential input first and second edges are represented as rising edges, they may also be falling edges, or a combination of rising and falling edges.

In one aspect as shown, the nth sort-and-delay circuit (202-n) in a plurality of n sort-and-delay circuits supplies a time-differential residue signal on line 210. Then, the bit decoder 206 supplies a digital output signal on line 208 representing the n most significant bits in a p-bit digital word. In this aspect, the sort-and-delay TDC 200 further comprises a backend TDC 212 having an input on line 210 to accept the time-differential residue signal and an output on line 214 to supply a digital output signal comprising the (p−n)th least significant bits of the p-bit digital word. The backend TDC 212 may be enabled using a conventional technology, such as Flash, gated ring-oscillator, delay chain oscillator, or Vernier delay line, to name a few examples.

Figure 3A:
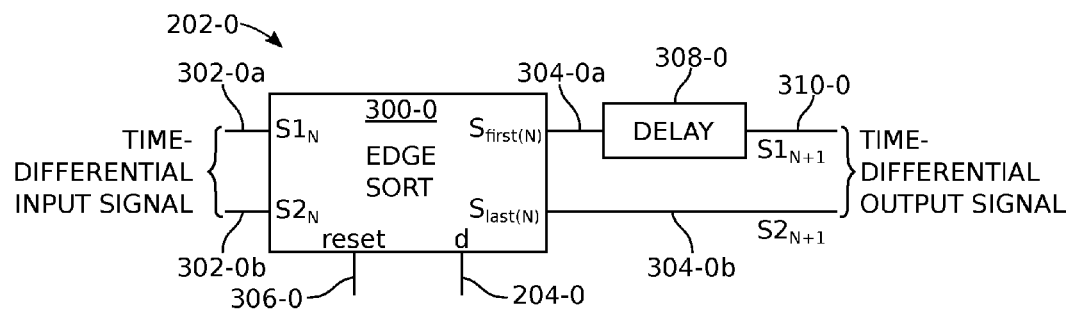
FIG. 3A is a schematic block diagram of a sort-and delay circuit.
Figure 3B:
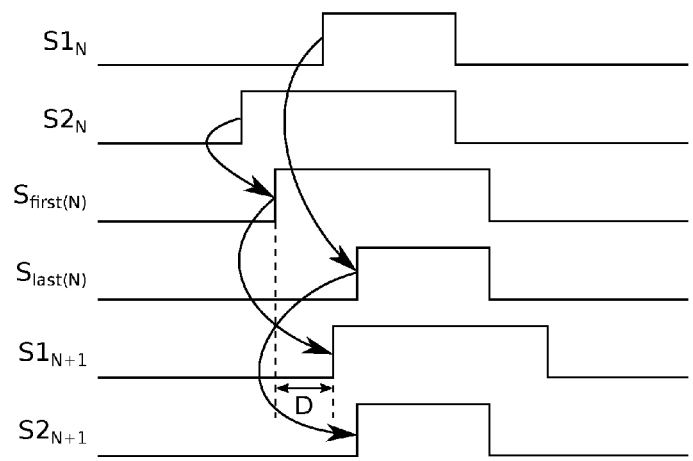
FIG. 3B is an associated timing diagram.

FIG. 3A is a schematic block diagram of a sort-and delay circuit, and FIG. 3B is an associated timing diagram. Each sort-and-delay circuit, for example sort-and-delay circuit 202-0, comprises an edge sort circuit, with edge sort circuit 300-0 being shown as an example. Edge sort circuit 300-0 has an input on lines 302-0a ($S1_N$) and 302-0b ($S2_N$) to accept a time-differential input signal. The edge sort circuit 300-0 determines the order in which the first and second edges are accepted. Edge sort circuit 300-0 has a first output on line 304-0a ($S_{first(N)}$) to supply the leading edge, a second output on line 304-0b ($S_{last(N)}$) to supply the trailing edge, and a third output on line 204-0 (d) to supply the TDC coded bit. A reset is shown on line 306-0, which is explained in more detail below. A delay circuit 308-0 with a time delay duration of D, has an input operatively connected to the first output of the edge sort circuit on line 304-0a, and an output on line 310-0 to supply a delayed edge.

As used herein, "operatively connected" means directly connected or connected through an intervening element (e.g., a time amplifier, as described below). The delayed edge on line 310-0 ($S1_{N+1}$) and the trailing edge on line 304-0b ($S2_{N+1}$) comprise a time-differential output signal. Typically, the time duration D of each stage is less than the maximum input duration of the time-differential input signal. Further, due to the successive compression of the time-differential signals, the fixed delay D of each successive sort-and delay circuit decreases at a comparable rate. As used herein, a time-differential output signal is compressed when the time-differential input signal is within the range −T1/2 to +T1/2, and the time-differential output signal within the range −T2/2 to +T2/2, and T2<T1. This concept is illustrated in FIG. 13A, where the sorting operation first compresses the input range from −T1/2 to +T1/2, to the range −T1/2 to 0. A subsequent delay operation shifts the range up by D and the output range becomes −T2/2 to +T2/2. In this example T2 is approximately T1/2. Alternately considered, "compression" may be considered as a form of subtraction with the time duration of D.

Figure 4:
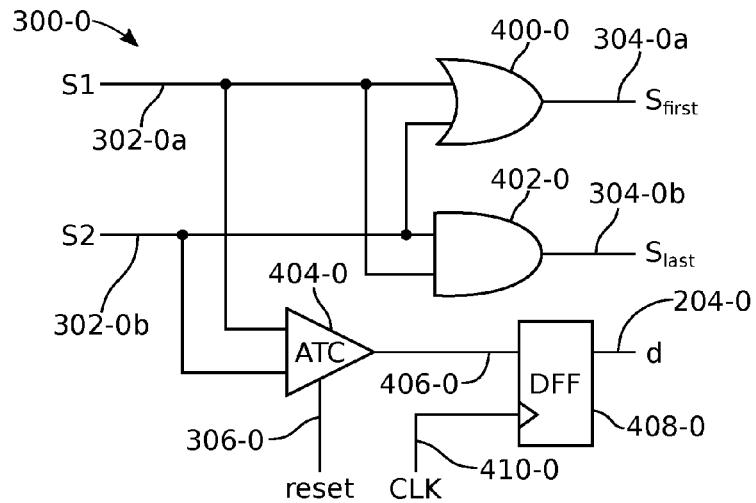
FIG. 4 is a schematic block diagram depicting a first variation of an edge sort circuit.

FIG. 4 is a schematic block diagram depicting a first variation of an edge sort circuit. Using the edge sort circuit 300-0 as an example, the edge sort circuit comprises an OR gate 400-0 having a first input on line 302-0a to accept the first edge, a second input on line 302-0b to accept the second edge, and an output on line 304-0a to supply the leading edge. An AND gate 402-0 has a first input on line 302-0a to accept the first edge, a second input on line 302-0b to accept the second edge, and an output on line 304-0b to supply the trailing edge. An arrival time comparator (ATC) 404-0 has a first input on line 302-0a to accept the first edge, a second input on line 302-0b to accept the second edge, and an output on line 406-0 to supply an order signal responsive to the order in which the first and second edges are received. In this version the routing is automatic and does not depend on the ATC. One advantage of this edge sort circuit variation is that it is fast and simple, but it suffers from two potential shortcomings: it is not guaranteed that the ATC detection of the order of arrival matches the automatic routing performed by the logic gates. The second issue has to do with the transistor level implementation of the AND and OR gates, which makes the gate delay dependent on the proximity of the signal changes at the two inputs.

In one aspect, the ATC 404-0 has a reset input on line 306-0 to accept a reset signal responsive to the trailing edge, which may occur concurrently with the trailing edge or sometime after the trailing edge, on the condition that it occurs before the arrival of the next time-differential input signal. A register 408-0, such as a D flip-flop (DFF), has an input connected to the ATC output on line 406-0, a clock input to accept a clock (CLK) signal 410-0, and an output to supply the TDC coded bit on line 204-0. The clock on line 410-0 must arrive before or simultaneously with the reset signal on line 306-0. One possibility is to use the leading edge of a common signal to generate the clock and the trailing edge of the common signal to generate the reset. Note: the above-described circuitry can be enabled using other variations of combinational logic, as would be understood by one with ordinary skill in the art.

A multiplexing function is preformed automatically with the AND and OR gates without any control signals. The ATC is used only to provide the digital output bit. This implementation has a shorter propagation delay than the variation depicted in FIG. 5, but may suffer from accuracy problems close to the input zero crossing, due to the offset in the ATC 404-0.

Figure 5:
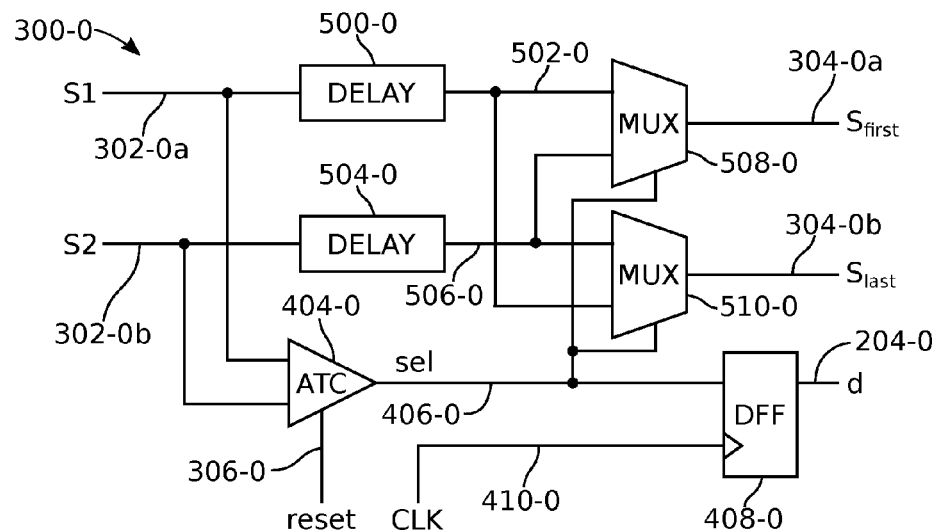
FIG. 5 is a schematic block diagram depicting a second variation of an edge sort circuit.

FIG. 5 is a schematic block diagram depicting a second variation of an edge sort circuit. In this variation, the edge sort circuit 300-0 comprises a first delay 500-0 having an input on line 302-0a to accept the first edge and an output on line 502-0 to supply a delayed first edge, delayed a first period of time. A second delay 504-0 has an input to accept the second edge on line 302-0b and an output on line 506-0 to supply a delayed second edge, delayed a second period of time. Typically, the first and second periods of time are the same, or intended to be the same. However, this circuit variation can also be enabled using delays of different durations.

A first multiplexor (MUX) 508-0 has a control input to accept the order (select) signal on line 406-0, a first input on line 502-0 to accept the delayed first edge, a second input on line 506-0 to accept the delayed second edge, and an output on line 304-0a to supply the leading edge in response to the order signal. A second MUX 510-0 has a control input on line 406-0 to accept the order signal, a first input on line 506-0 to accept the delayed second edge, a second input on line 502-0 to accept the delayed first edge, and an output on line 304-0b to supply the trailing edge in response to the order signal. The ATC 404-0 has a first input on line 302-0a to accept the first edge, a second input on line 302-0b to accept the second edge, and an output on line 406-0 to supply the order signal responsive to the order in which the first and second edges are routed. In one aspect, the ATC 404-0 has a reset input on line 306-0 to accept a reset signal responsive to the trailing edge. As above, the reset may occur concurrently with the trailing edge or sometime after the trailing edge, on the condition that it occurs before the arrival of the next time-differential input signal. The register 408-0 (e.g., DFF) has an input connected to the ATC output on line 406-0, a clock input to accept a clock signal 410-0, and an output to supply the TDC coded bit on line 204-0.

The arrival time comparator 404-0 detects the incoming edge order and sets the output multiplexers accordingly. Nominally equal delays are inserted into the signal path to give the ATC some time to make its decision and to program the MUXs before the signals arrive at the MUX inputs. The ATC has a reset signal to reset its state between different samples. A clocked D flip-flop captures the ATC output and provides the digital output bit. The reset timing is not critical; it just needs to occur between two successive input samples.

Figure 6:
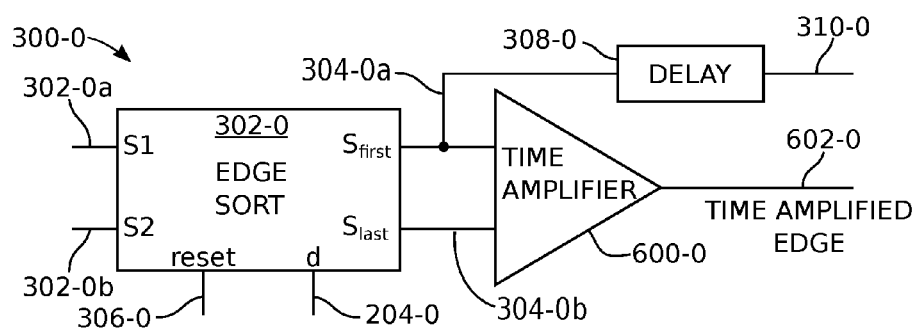
FIG. 6 is a schematic block depicting a variation of the sort-and-delay circuit further comprising a time amplifier.

FIG. 6 is a schematic block depicting a variation of the sort-and-delay circuit further comprising a time amplifier. The time amplifier 600-0 had an input on line 304-0a to accept the leading edge and an input on line 304-0b to accept the trailing edge, where the leading and trailing edges are separated by a third duration of time. The time amplifier 600-0 has an output on line 602-0 to supply a time-amplified edge. The delayed edge and the time-amplified edge comprise an amplified time-differential output signal, where the leading edge and time-amplified edges are separated by an amplified duration of time, directly proportional to the third duration. Using sort-and-delay circuit 300-0 as an example, a single-ended time amplifier 600-0 is shown, as described in more detail below.

Figure 7A:
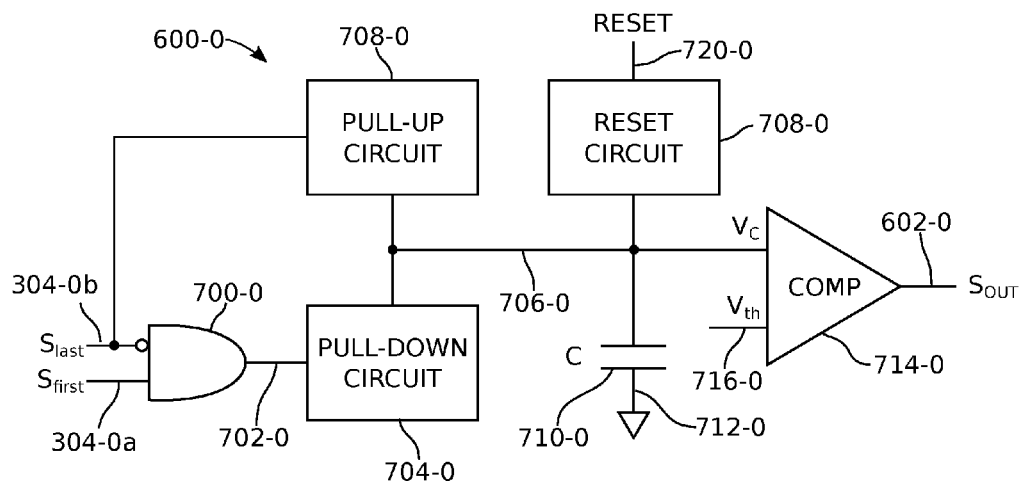
FIGS. 7A and 7B are schematic block diagrams depicting variations of the single-ended time amplifier of FIG. 6 in greater detail.
Figure 7B:
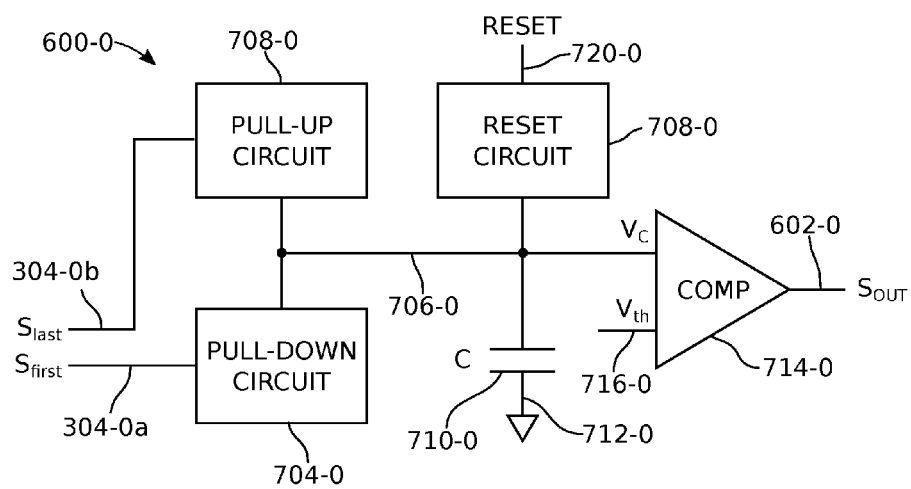
Figure 7C:
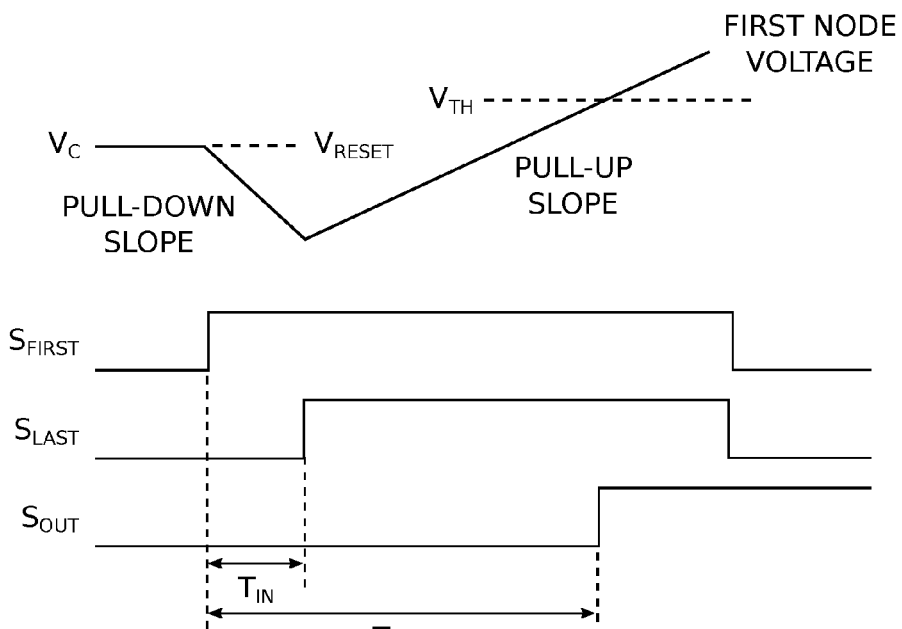
FIG. 7C is a timing diagram associated with FIG. 7A or 7B.

FIGS. 7A and 7B are schematic block diagrams depicting variations of the single-ended time amplifier of FIG. 6 in greater detail, and FIG. 7C is a timing diagram associated with FIG. 7A or 7B. Using single-ended time amplifier 600-0 as an example, the time amplifier comprises a logic circuit 700-0 having an input on lines 304-0a ($S_{first}$) and 304-0b ($S_{last}$) to respectively accept the leading edge and the trailing edge, and an output on line 702-0 to supply an enable signal for the third duration of time ($T_{in}$) in response to accepting the leading edge. Here, the logic circuit 700-0 is enabled as an AND gate with one inverted input, however, the enable signal on line 702-0 can be created using other types of combinational logic. A pull-down circuit 704-0 has an input on line 702-0 to accept the enable signal and an output on line 706-0 to supply a pull-down current to a first node (line 706-0), initially set to a first voltage level (Vc), in response to the enable signal. A pull-up circuit 708-0 has an input on line 302-0b to accept the trailing edge and an output on line 706-0 to supply a pull-up current to the first node in response to the trailing edge.

A capacitor 710-0 (C) has a first terminal connected to the first node on line 706-0 and a second terminal connected to a reference voltage (e.g., ground) on line 712-0. A comparator 714-0 has a first input connected to a threshold voltage (Vth) on line 716-0, a second input connected to the first node on line 706-0, and an output on line 602-0 ($S_{out}$) to supply a time-amplified edge. The leading edge (304-0a, see FIG. 6) and the time-amplified edge on line 602-0 are separated by an amplified duration of time ($T_{out}$), directly proportional to the third duration of time ($T_{in}$), which is the difference in time between the leading and trailing edges. The delayed edge and the time-amplified edge are referred to as an amplified time-differential output signal. A reset circuit 718-0 has an input on line 720-0 to accept a reset signal and an output connected to the first node on line 706-0 to supply the first voltage level in response to the reset signal. The reset circuit 718-0 resets the voltage Vc to a reset level, which is below the comparator threshold Vth.

FIG. 7B is similar to FIG. 7A except that a logic circuit is not required. The $S_{first}$ signal on line 304-0a is fed directly to pull-down circuit 704-0, and the $S_{last}$ signal on line 304-0b is fed directly to pull-up circuit 708-0. In contrast to the circuit of FIG. 7A, the pull-down current is not stopped by the trailing input edge. Instead, the pull-up current is made larger (for instance 2×) to cancel the pull down-current and to make the overall current direction pull-up. This variation overcomes some potential issues in generating very narrow pulses with an AND gate.

When the leading edge arrives it activates the pull-down circuit, which starts to ramp down the voltage Vc. The trailing edge disables the pull-down circuit (FIG. 7A only) and enables the pull-up circuit, which changes the voltage ramp direction to up. Once the first node voltage reaches the comparator threshold level Vth, the comparator output voltage goes high. The gain of the amplifier is defined by the relative up and ramp rates. When the ramp rates are equal, the gain is two.

Figure 8:
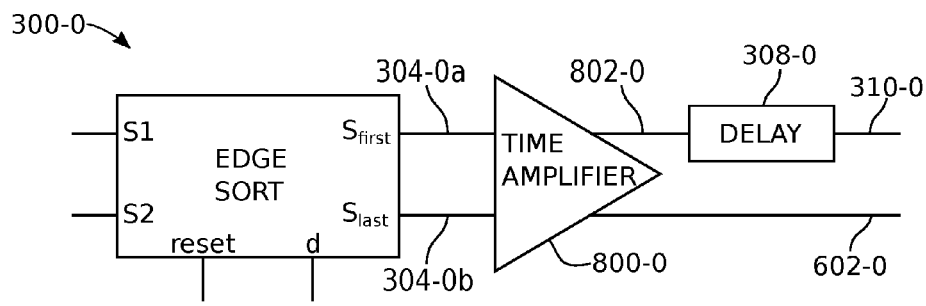
FIG. 8 is a schematic block depicting a variation of the sort-and-delay further comprising a differential time amplifier.

FIG. 8 is a schematic block depicting a variation of the sort-and-delay further comprising a differential time amplifier. Using sort-and-delay circuit 300-0 as an example, differential time amplifier 800-0 is shown, having outputs on line 802-0 and 602-0.

Figure 9:
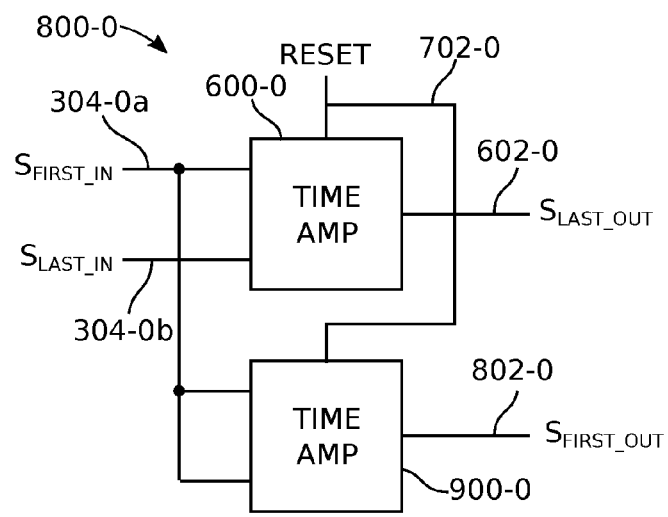
FIG. 9 is a block diagram depicting the differential time amplifier of FIG. 8.

FIG. 9 is a block diagram depicting the differential time amplifier of FIG. 8. As explained in greater detail below (FIGS. 10A and 10B), the differential time amplifier is essentially a modified single-ended time amplifier 900-0 connected in parallel with the single-ended time amplifier 600-0.

Figure 10A:
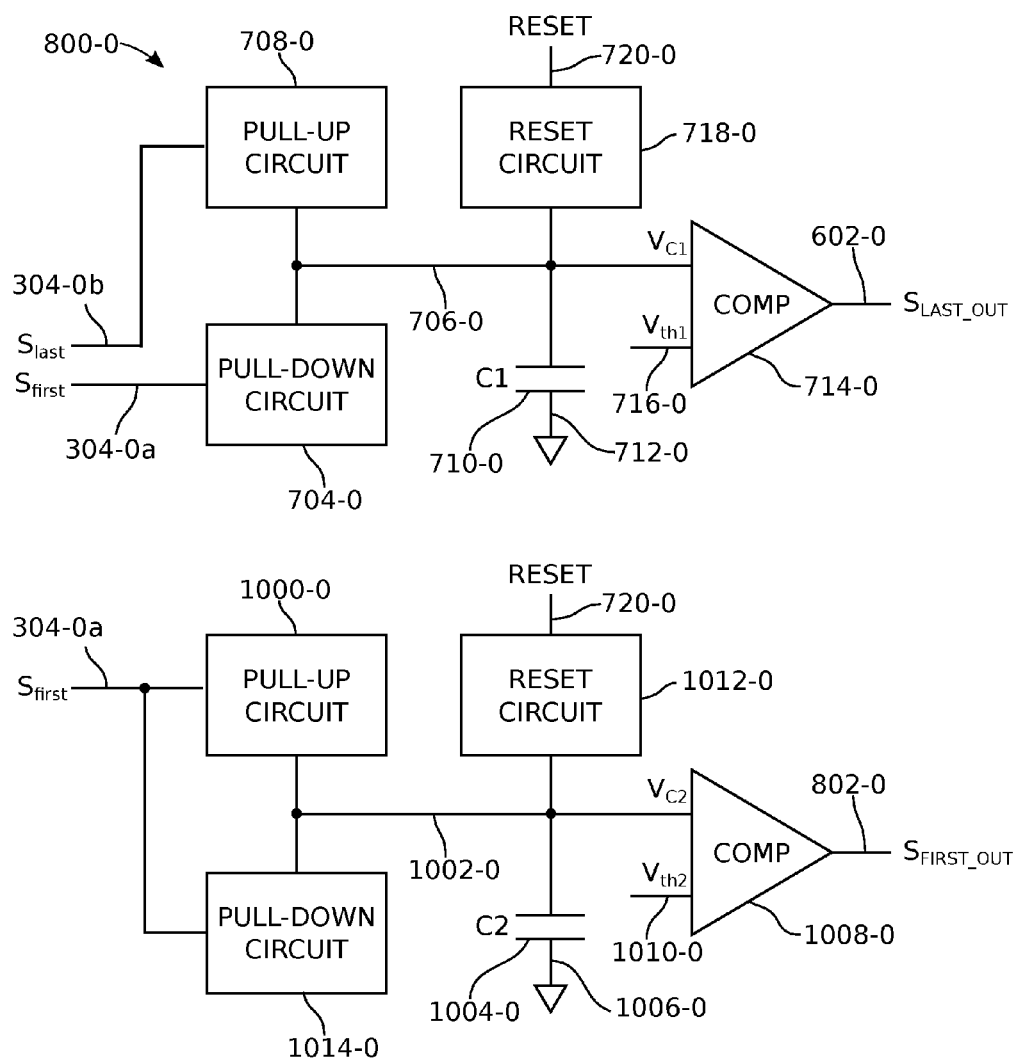
FIG. 10A is a schematic block diagram of the differential time amplifier of FIG. 9 in greater detail.
Figure 10B:
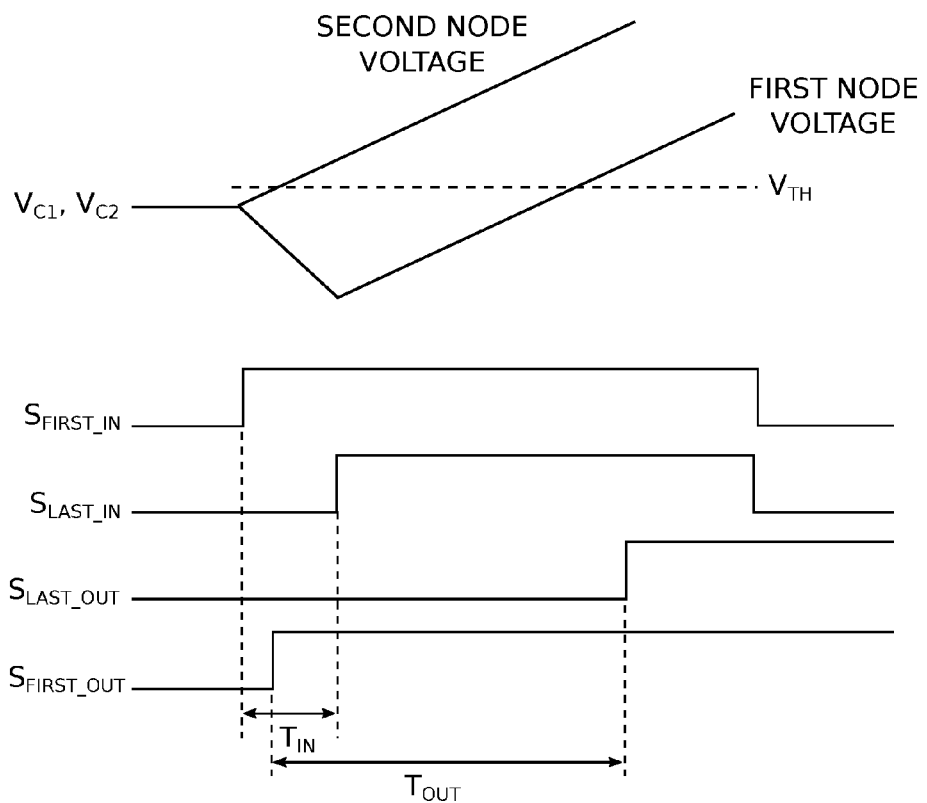
FIG. 10B is an associated timing diagram.

FIG. 10A is a schematic block diagram of the differential time amplifier of FIG. 9 in greater detail, and FIG. 10B is an associated timing diagram. Using differential time amplifier 800-0 as an example, the time amplifier has an input on lines 304-0a ($S_{first}$) and 304-0b ($S_{last}$) to respectively accept the leading edge and the trailing edge. A first pull-down circuit 704-0 has an input on line 304-0a to accept the leading edge and an output on line 706-0 to supply a pull-down current to a first node (line 706-0), initially set to a first voltage level (Vc1), in response to the leading edge. A first pull-up circuit 708-0 has an input on line 304-0b to accept the trailing edge and an output on line 706-0 to supply a pull-up current to the first node in response to the trailing edge.

A capacitor 710-0 (C1) has a first terminal connected to the first node on line 706-0 and a second terminal connected to a reference voltage on line 712-0. A comparator 714-0 has a first input connected to a threshold voltage (Vth1) on line 716-0, a second input connected to the first node on line 706-0, and an output on line 602-0 ($S_{last\_out}$) to supply a time-amplified edge. Alternatively, the circuit of FIG. 7A may be used.

A second pull-up circuit 1000-0 has an input to accept the leading edge on line 304-0a and an output on line 1002-0 to supply a pull-up current to a second node, initially set to a second voltage level (Vc2), in response to the leading edge. A second pull-down circuit 1014-0 has an input on line 304-0b to accept the leading edge and an output on line 1002-0 to supply a pull-down current to the second node in response to the leading edge. A second capacitor 1004-0 has a first terminal connected to the second node on line 1002-0 and a second terminal connected to a second reference voltage on line 1006-0. A second comparator 1008-0 has a first input connected to a second threshold voltage (Vth2) on line 1010-0, a second input connected to the second node on line 1002-0, and an output to connected to the input of the delay circuit 308-0 on line 802-0 ($S_{first\_out}$). The leading edge (on line 304-0a, see FIG. 8) and the time-amplified edge on line 602-0 are separated by an amplified duration of time ($T_{out}$), directly proportional to the third duration of time ($T_{in}$), which is the difference in time between the leading and trailing edges. The delayed edge and the time-amplified edge are an amplified time-differential output signal. In this example, Vth1=Vth2=Vth. However, in other embodiments the threshold levels may be set to different voltages. Likewise, initial voltages Vc1 and Vc2 are equal in this example, but need not necessarily be so in other embodiments due to design or due to some random or systematic mismatch between the two. The second single-ended amplifier, with its inputs tied together in the differential amplifier, produces the same delay as the first single-ended amplifier for a zero input ($S_{first\_in}=S_{last\_in}$). If the two circuits are perfectly matched, a zero input produces a zero output with constant delay components cancelled.

A reset circuit 718-0 has an input on line 720-0 to accept a reset signal and a output connected to the first node on line 706-0 to supply the first voltage level in response to the reset signal. A second reset circuit 1012-0 has an input to accept a second reset signal (typically the same as the first reset signal on line 720-0) and an output connected to the second node on line 1002-0 to supply the second voltage level in response to the second reset signal. Again, the reset signal is shown as the same for reset circuits 718-0 and 1012-0, but they need not be so. The purpose of the reset is to prepare the amplifier for the next sample. It needs to occur between the output edge (N) and the first input edge (N+1). Whether the reset signal is a clock pulse with regular timing or a self-generated reset pulse based on the output edge doesn't matter. That is, the reset can be generated from a system clock or generated from the trailing edge. If generated from a system clock, it may be the same reset signal used for the ATC in the edge sort circuit, which is a periodic clock-like signal having a period related to the TDC sampling (or update) rate.

FIG. 11 is a schematic block diagram depicting the sort-and-delay TDC in slightly greater detail than shown in FIG. 2. The TDC consists of several cascaded stages, with the most significant bit (MSB) of the digital output being resolved in the front stage and the other bits in the following stages resolved in descending order. The principle of operation follows the successive approximation method. The time interval is converted into a digital word in several successive steps carried out one bit per TDC stage. Once a stage has completed its task, it passes the signal residue to the next stage. After passing the residue signal, the stage is reset and becomes ready to process the next sample.

After a certain number of stages (e.g., n) the residue output 210 (S1 and S2, see FIG. 12) becomes quite small and it may be advantageous to use another type of TDC (e.g., backend TDC 212) to further process the residue output to obtain more digital resolution. The digital output of this backend TDC on lines 1206-0 ($dt_0$) through 1206-k ($dt_K$) (see FIG. 12) is combined with the MSBs obtained from the cascaded stages (on line 208, see FIG. 3).

The operation carried out by a TDC stage consists of sorting the incoming edges in order of arrival and routing the first to arrive to a first output and the last to arrive to a second output. The first output is further passed through a delay cell. These two signals, the delayed first output and the second output, form a residue signal that is passed on to the next stage. Repeating this process through several stages with decreasing delays has the effect of bringing the residue signal edges closer together. This is somewhat analogous to the operation of a pipelined or successive approximation analog-to-digital converter (ADC). The TDC stage also records the routing decision and outputs it as a digital bit. The digital output of the TDC can be calculated from the output bits of the stages using the knowledge of the magnitudes of the delays in each stage.

In its simplest form the TDC consists of stages with binary delays, with the delay in the first stage being T/2, in the second T/4, in the third T/8, and so forth. The digital output is simply calculated by performing a Gray-to-binary conversion to the digital word formed from the stage output bits. In practice, some form of trimming may be required to implement the exact delays with precisely binary weights.

Another alternative is to rely upon digital calibration to implement approximately binary delays, while making sure that the sum of the downstream delays is large enough to avoid missing codes. In practice this means scaling the delays from one stage to the next with a factor of slightly less than 2.0. This method requires measuring the actual delays and using the measured values to calculate the final digital output. The measurement can be implemented as a foreground or background calibration, or as a combination of the two.

Figure 12:
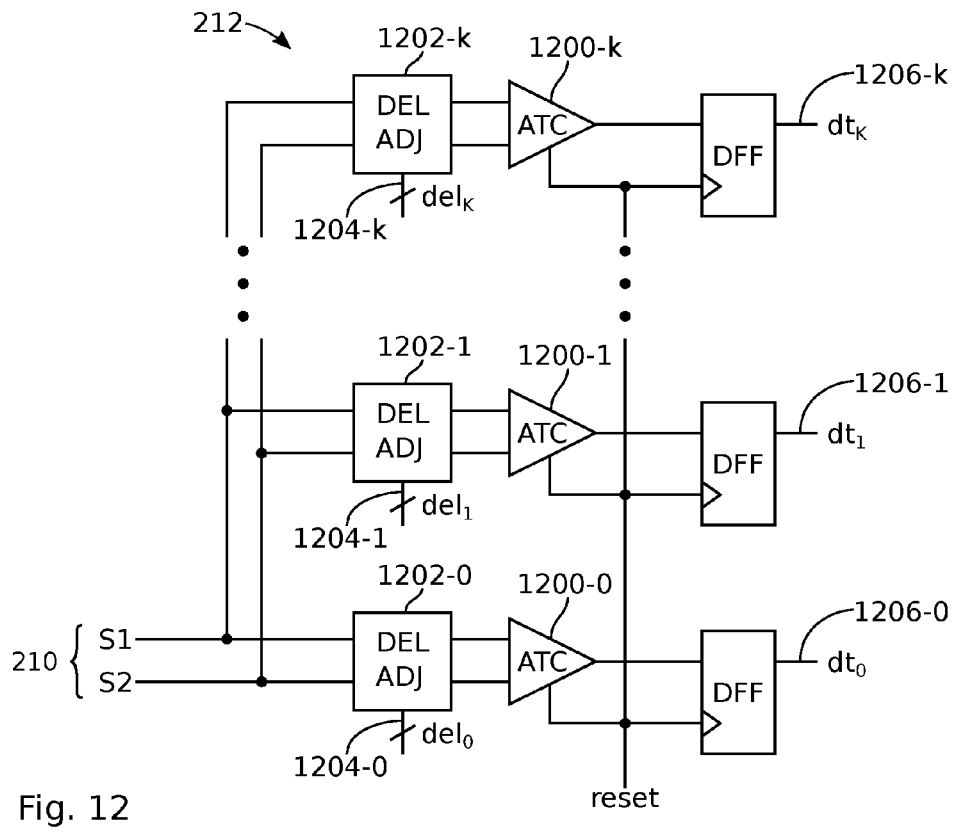
FIG. 12 is a schematic block diagram depicting an exemplary backend TDC.

FIG. 12 is a schematic block diagram depicting an exemplary backend TDC. This flash type backend TDC 212 is based on an array of ATCs 1200-0 through 1200-k in series with adjustable delay blocks 1202-0 through 1202-k. A calibration procedure is used to program the delays on lines 1204-0 ($del_0$) through 1204-k ($del_K$) to achieve the desired quantization levels.

It is also possible to include gain in one or more of the sort-and-delay TDC stages. This relaxes the LSB size and the noise requirements of the following stages. Implementing a time amplifier can be tricky but the task becomes more practical if the input signal is small and the amplifier only has to deal with positive time intervals. Inserting the amplifier before the stage delay satisfies the latter requirement.

Figure 13B:
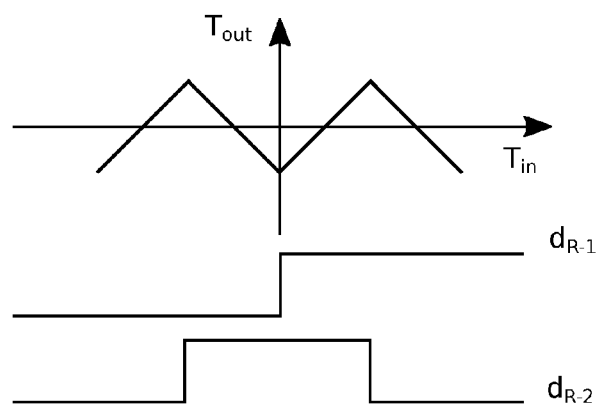
FIGS. 13A and 13B are diagrams depicting sort-and-delay circuit transfer functions.
Figure 13A:
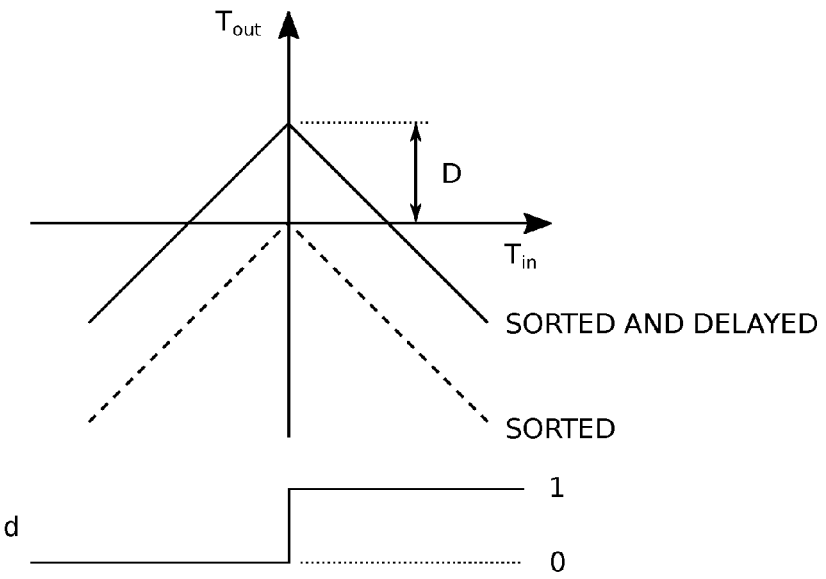

FIGS. 13A and 13B are diagrams depicting sort-and-delay circuit transfer functions. The transfer function of a single TDC stage, from the input to the residue output (solid line), is shown in FIG. 13A. The dotted line represents the signal after the edge sort circuit. When the negative (stop) input arrives before the positive (start) one, it is routed to the first output. Once the edges cross, the routing order is changed causing a fold in the transfer function. Adding the delay to the first output (leading edge) shifts the curve up, centering it around zero. This has the desired effect of compressing the incoming signal range to approximately half at the output. In other words, the transfer function of a single stage is $y=(d \cdot x)-D$, where d is a digital output bit, either +1 or −1, and D is a fixed delay. When a time amplifier is used, the transfer function is $y=A \cdot (d \cdot x)-D$, where "A" is the gain of the time amplifier.

FIG. 13B depicts the signal transfer function of two cascaded sort-and-delay circuits. The time-differential signal output bits $d_{R-1}$ and $d_{R-2}$ form a Gray code that provides some insensitivity against decision metastability. Note: $d_{R-1}$ is associated with the MSB.

Figure 14:
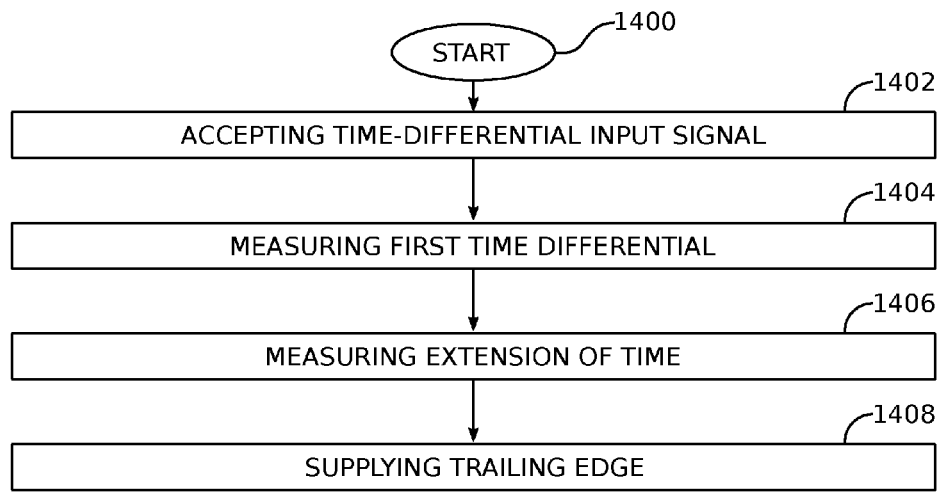
FIG. 14 is a flowchart illustrating a method for amplifying the duration of a time-differential signal.

FIG. 14 is a flowchart illustrating a method for amplifying the duration of a time-differential signal. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence.

Generally however, the method follows the numeric order of the depicted steps. The method starts at Step 1400.

Step 1402 accepts a time-differential input signal comprising a binary level leading edge followed by a pre-amplified duration of time by a binary level trailing edge. Step 1404 measures the pre-amplified duration of time. Step 1406 measures an amplified duration of time that is directly proportional to the pre-amplified duration of time. Step 1408 supplies a time-amplified edge separated from the leading edge by the amplified duration of time. In the case of a time differential amplifier, Step 1408 supplies the leading edge, followed the amplified duration of time by the time-amplified edge.

Figure 15:
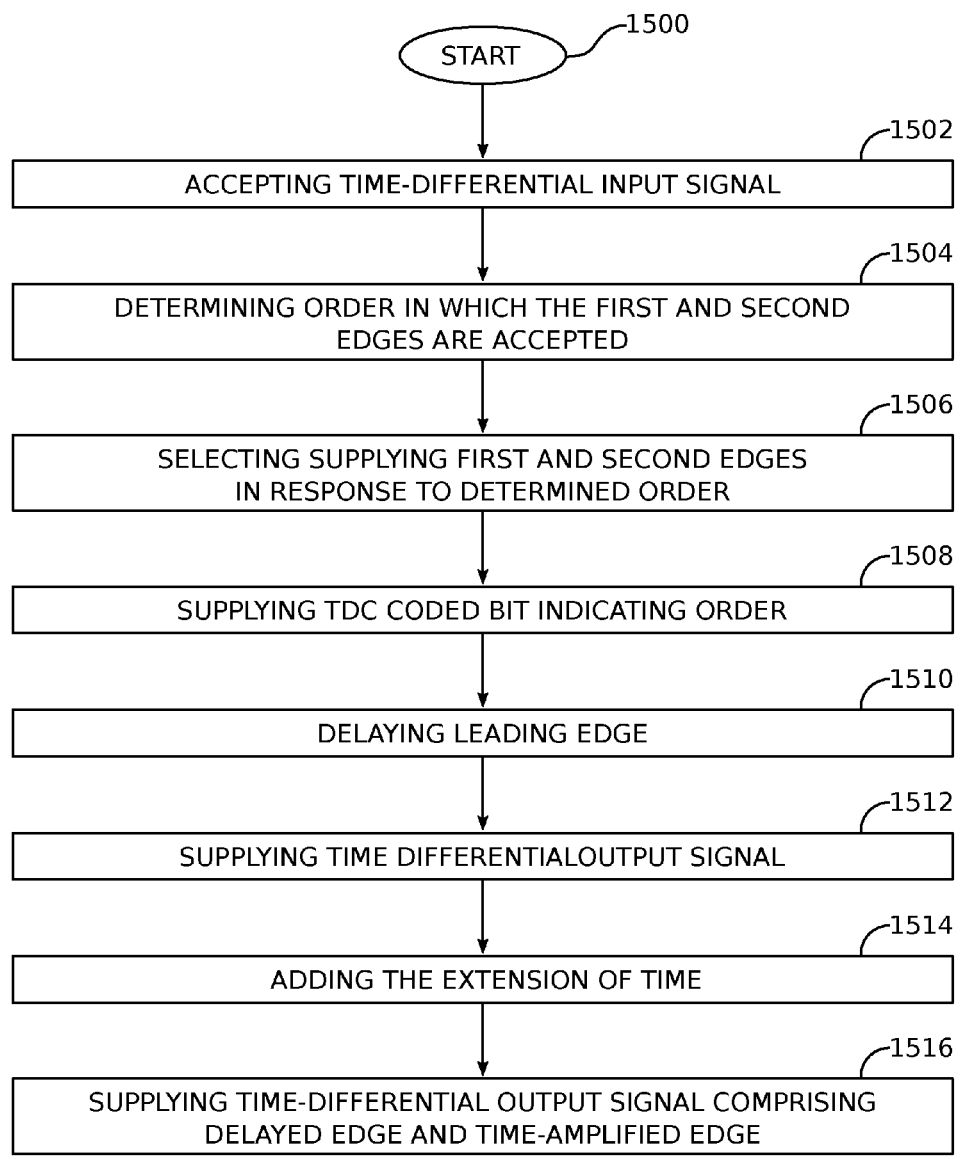
FIG. 15 is a flowchart illustrating a successive approximation TDC method.

FIG. 15 is a flowchart illustrating a successive approximation TDC method. The method begins at Step 1500. Step 1502 accepts a time-differential input signal comprising a binary level first edge separated from a binary level second edge by a first (input) duration of time. Step 1504 determines the order in which the first and second edges are accepted. Step 1506 selectively supplies the first and second edges as a leading edge and a trailing edge in response to the determined order. Step 1508 supplies a TDC coded bit indicating the order in which the first and second edges are routed. Step 1510 delays the leading edge to supply a delayed edge. Step 1512 supplies a time-differential output signal comprising the delayed edge and the trailing edge, where the delayed and trailing edge signals are separated by a second (output) duration of time representing a compression of the first (input) duration of time.

In one aspect, Step 1514 adds an amplified duration of time to the trailing edge to supply an amplified time-amplified edge. Then, Step 1516 supplies a time-differential output signal comprising the delayed edge and the time-amplified edge, where the leading edge and trailing edge are separated by a third duration of time, and the leading edge and time-amplified edges are separated by an amplified duration of time, directly proportional to the third duration of time.

Figure 16:
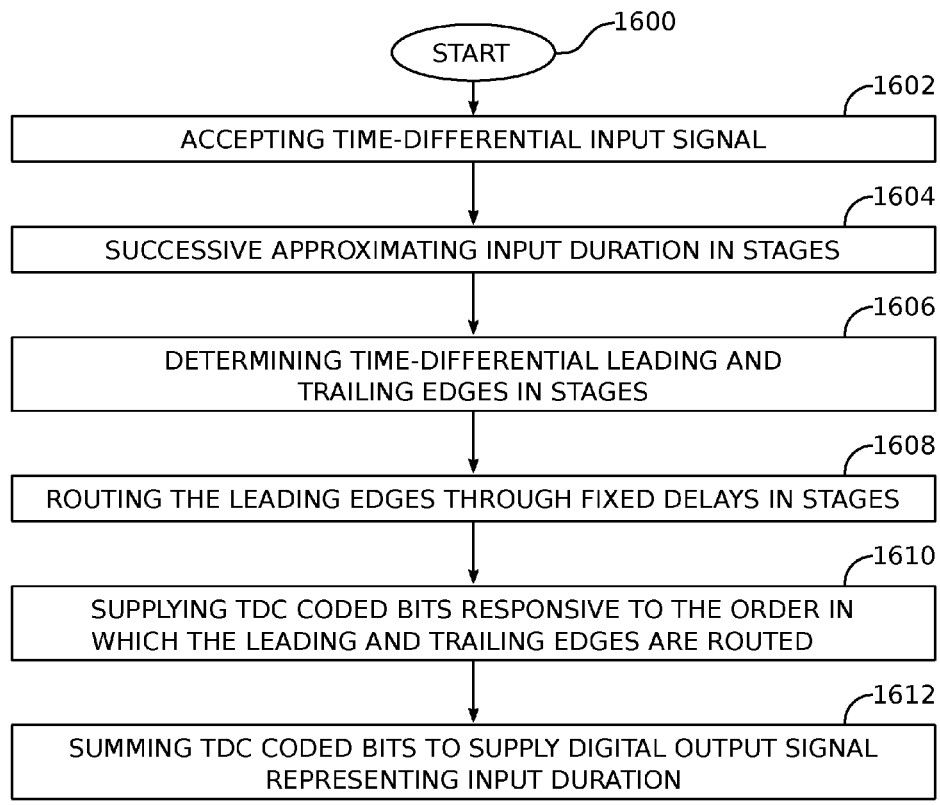
FIG. 16 is a flowchart illustrating a sort-and-delay TDC method.

FIG. 16 is a flowchart illustrating a sort-and-delay TDC method. The method begins at Step 1600. Step 1602 accepts a time-differential input signal comprising a binary level first edge separated from a binary level second edge by an initial input duration of time. Step 1604 successively approximates the input duration of time in a plurality of stages. At each stage, Step 1606 determines a time-differential leading edge and a time-differential trailing edge. At each stage, Step 1608 routes the leading edge through a fixed delay, where the fixed delay of a subsequent stage is less than the fixed delay of a preceding stage. At each stage, Step 1610 supplies a TDC coded bit responsive to the order in which the first and second edges are routed. In other words, the TDC coded bit represents the order in which the leading and the trailing edge are supplied, which in the ideal case is the same as the order of arrival of the input edges. However, if an error is made in determining the arrival order when the edges are very close to one another, the error has no effect in the TDC operation as long as the digital bit represents the actual routing decision.

In contrast to prior art methods, which simply add delay based on the arrival order, the method disclosed herein routes the signal through delay and no-delay paths based on the arrival order. This is a subtle but important difference. The routing has the effect of selectively inverting the time-differential signal that passes through the TDC stage, which produces Gray coded output bits. The Gray coding makes the TDC less sensitive to ATC metastability errors. The method also provides an always-positive time differential signal at the output of the edge sort circuits. This enables the use of simple time amplifiers capable of operating on positive (start) signals only.

Step 1612 sums the TDC coded bits from each stage to supply a digital output signal representing the initial input duration of time. In one aspect, Step 1602 includes a first stage accepting a first time-differential signal. Then, routing the leading edge through a fixed delay in Step 1608 includes the first stage supplying a second time differential signal to a subsequent second stage, where the difference between the leading edge and the trailing edge is guaranteed to represent a time delay greater than or equal to zero. That is, regardless of any arrival time interpretation errors in the first stage, it is guaranteed that the second time-differential signal first edge can be treated as a start signal by the second stage.

Systems and methods have been provided for a sort-and-delay TDC, along with the supporting functions of edge sorting and time amplification. Examples of particular sub-circuits and hardware units have been presented to illustrate the invention. However, the invention is not limited to merely these examples. Other variations and embodiments of the invention will occur to those skilled in the art.

I claim:

1. A method for amplifying the duration of a time-differential signal, the method comprising:
a time amplifier circuit with inputs accepting a time-differential input signal comprising a binary level leading edge followed a pre-amplified duration of time by a binary level trailing edge;
measuring the pre-amplified duration of time between the leading edge and the trailing edge;
measuring an amplified duration of time that is directly proportional to the pre-amplified duration of time; and,
the time amplifier circuit having outputs supplying a differential time-amplified output signal comprising a time-amplified edge separated from the leading edge by the amplified duration of time.

2. The method of claim 1 wherein the differential time-amplified output signal includes the leading edge, followed the amplified duration of time by the time-amplified edge.

3. The method of claim 1 wherein measuring the pre-amplified duration of time includes:
supplying a pull-down current to a first node, initially set to a first voltage level, in response to the leading edge;
supplying a pull-up current to the first node, in response to the trailing edge;
wherein measuring the amplified duration of time includes:
in response to the pull-up current, charging a capacitor connected to the first node;
comparing a voltage on the first node to a first threshold voltage; and,
wherein supplying the time-amplified edge includes supplying a time-amplified edge of a binary level time-amplified output signal, in response to the comparison, that is directly proportional to the pre-amplified duration of time.

4. The method of claim 3 further comprising;
resetting the first node to the first voltage level in response to a first reset signal.

5. The method of claim 3 supplying the differential time-amplified output signal includes:
supplying a pull-up current to a second node, initially set to a second voltage level, in response to the leading edge;
in response to the pull-up current, charging a capacitor connected to the second node;

comparing a voltage on the second node to a second threshold voltage to create a binary level conditioned leading edge in response to the comparison; and, supplying a differential time-amplified output signal comprising the conditioned leading edge and the time-amplified edge.

6. The method of claim 5 further comprising;

resetting the second node to the second voltage level in response to a second reset signal.

7. A successive approximation time-to-digital converter (TDC) method, the method comprising:

a sort-and delay circuit having inputs accepting a time-differential input signal comprising a binary level first edge separated from a binary level second edge by a first duration of time;

determining an order in which the first and second edges are accepted;

selectively supplying the first and second edges as a leading edge and a trailing edge in response to the determined order;

supplying a TDC coded bit indicating the order in which the first and second edges are routed;

delaying the leading edge to supply a delayed edge; and, the sort-and-delay circuit having outputs supplying a time-differential output signal comprising the delayed edge and the trailing edge, where the delayed edge and trailing edge are separated by a second duration of time representing a compression of the first duration of time.

8. The method of claim 7 further comprising:

adding an amplified duration of time to the trailing edge, to supply a time-amplified edge; and, supplying an amplified time-differential output signal comprising the delayed edge and the time-amplified edge, where the leading edge and trailing edge are separated by a third duration of time, and the leading edge and time-amplified edge are separated by the amplified duration of time, directly proportional to the third duration of time.

9. The method of claim 7 wherein selectively supplying the first and second edges as the leading edge and the trailing edge in response to the determined order includes:

logically ORing the first edge and the second edge, to supply the leading edge;

logically ANDing the first edge and the second edge, to supply the trailing edge; and, wherein supplying the TDC coded bit indicating the order in which the first and second edges are routed includes supplying the TDC coded bit indicating the order in which the first and second edges are received.

10. The method of claim 9 wherein supplying the TDC coded bit indicating the order in which the first and second edges are received includes:

storing the TDC coded bit in a register;

supplying the TDC bit from the register in response to a clock signal; and, resetting the determination of the order in which the first and second edges are received, in response to the trailing edge.

11. The method of claim 7 wherein selectively supplying the first and second edges as the leading edge and the trailing edge in response to the determined order includes:

adding a first delay to the first edge to supply a delayed first edge, delayed a first period of time;

adding a second delay to the second edge to supply a delayed second edge, delayed a second period of time;

multiplexing the delayed first edge and the delayed second edge to supply the leading edge in response to an order signal;

multiplexing the delayed first edge and the delayed second edge to supply the trailing edge in response to the order signal; and, wherein supplying the TDC coded bit indicating the order in which the first and second edges are routed includes supplying the TDC coded bit indicating the order in which the first and second edges are received.

12. The method of claim 11 wherein supplying the TDC coded bit indicating the order in which the first and second edges are received includes:

storing the TDC coded bit in a register;

supplying the TDC bit from the register in response to a clock signal; and, resetting the determination of the order in which the first and second edges are received, in response to the trailing edge.

13. The method of claim 7 further comprising:

measuring a pre-amplified duration of time between the leading edge and the training edge;

measuring an amplified duration of time that is directly proportional to the pre-amplified duration of time; and, supplying a differential time-amplified signal comprising a time-amplified edge separated from the leading edge by the amplified duration of time.

14. The method of claim 13 wherein measuring the pre-amplified duration of time includes:

supplying a pull-down current to a first node, initially set to a first voltage level, in response to the leading edge;

supplying a pull-up current to the first node, in response to the trailing edge;

wherein measuring the amplified duration of time includes:

in response to the pull-up current, charging a capacitor connected to the first node;

comparing a voltage on the first node to a first threshold voltage; and, wherein supplying the time-amplified edge includes supplying a time-amplified edge of a binary level time-amplified output signal, in response to the comparison, that is directly proportional to the pre-amplified duration of time.

15. The method of claim 14 further comprising;

resetting the first node to the first voltage level in response to a first reset signal.

16. The method of claim 14 further comprising:

supplying a binary level conditioned leading edge as follows:

supplying a pull-up current to a second node, initially set to a second voltage level, in response to the leading edge;

in response to the pull-up current, charging a capacitor connected to the second node;

comparing a voltage on the second node to a second threshold voltage; and, wherein supplying the delayed edge includes delaying the conditioned leading edge to supply the delayed edge.

17. The method of claim 16 further comprising;

resetting the second node to the second voltage level in response to a second reset signal.

* * * * *